United States Patent [19]
Yajima

[11] Patent Number: 5,939,747
[45] Date of Patent: Aug. 17, 1999

[54] CAPACITOR PRODUCED IN A SEMICONDUCTOR DEVICE

[75] Inventor: Tsukasa Yajima, Tokyo, Japan

[73] Assignee: Oki Electric Industry Co., Ltd., Tokyo, Japan

[21] Appl. No.: 08/892,885

[22] Filed: Jul. 15, 1997

[30] Foreign Application Priority Data

Nov. 13, 1996 [JP] Japan .................................. 8-302108

[51] Int. Cl.⁶ .......................... H01L 27/108; H01L 29/76
[52] U.S. Cl. .......................... 257/309; 257/307; 257/311
[58] Field of Search .................... 257/307, 309, 257/311

[56] References Cited

U.S. PATENT DOCUMENTS

| | | | |
|---|---|---|---|
| 5,164,881 | 11/1992 | Ahn | 361/313 |
| 5,315,142 | 5/1994 | Acovic et al. | 257/316 |
| 5,512,768 | 4/1996 | Lur et al. | 257/309 |
| 5,719,419 | 2/1998 | Chao | 257/309 |

FOREIGN PATENT DOCUMENTS

| | | | |
|---|---|---|---|
| 42 21 431 A1 | 1/1994 | Germany | 257/309 |
| 4-99373 | 3/1992 | Japan . | |
| 4-264767 | 9/1992 | Japan . | |
| 7-161834 | 6/1995 | Japan . | |

*Primary Examiner*—Valencia Martin-Wallace
*Assistant Examiner*—George C. Eckert, II
*Attorney, Agent, or Firm*—Jones Volentine, L.L.P.

[57] ABSTRACT

A capacitor having the pipe structure produced in a semiconductor device, wherein the number of combinations of two pieces of pipe shaped electrodes which face to each other across a pipe shaped dielectric layer is plural, so that the capacitor of this invention is allowed to have a large surface area in which two electrodes face to each other across a dielectric layer, resultantly increasing the amount of electrostatic capacity per unit horizontal area thereof without being accompanied by a decrease in integration and a decrease in the mechanical reliability.

5 Claims, 10 Drawing Sheets

CAPACITOR PRODUCED IN A SEMICONDUCTOR DEVICE

FIELD OF THE INVENTION

This invention relates to improvements applicable to a capacitor produced in a semiconductor device and a method for production thereof. More specifically, this invention relates to improvements developed to increase the amount of electrostatic capacity per horizontal area of the capacitor produced in a semiconductor device.

BACKGROUND OF THE INVENTION

It is known that a capacitor can be produced in a semiconductor device. The capacitor produced in a semiconductor device is classified into two, including a stuck structure and a trench structure. The capacitor having the stuck structure is further classified into a thick film structure, a fin structure and a pipe structure. A capacitor having the pipe structure is assumed to be most promising in the near future. Since integration is one of the most important parameters for a semiconductor device, an increase in integration is naturally required for a capacitor produced in a semiconductor device.

A circuit in which a capacitor is connected in series with a field effect transistor is illustrated in FIGS. 1 and 2. FIG. 1 is a circuit diagram of the series circuit and FIG. 2 is the schematic cross section of a series circuit produced in a semiconductor device and in which a field effect transistor is connected in series with a capacitor having the pipe structure produced in a semiconductor device. The series circuit is frequently employed as a component of a dynamic random access memory having the one transistor and one capacitor structure. Referring to FIG. 1, an enhancement field effect transistor 1 is connected in series with a capacitor 2. Referring to FIG. 2, the field effect transistor 1 consists of a semiconductor substrate of one conductivity $1a$, an element separation area $1b$, a gate insulator layer $1c$, a source (an area of the other conductivity) $1d$, a drain (an area of the other conductivity) $1e$, a gate electrode if and an insulator layer for covering the gate electrode $1g$. The capacitor 2 consists of one electrode $2a$ which is a pipe having a closed bottom and which is made of conductive poly crystalline silicon, a dielectric layer $2b$ which is a layer of silicon dioxide covering the surface of the conductive poly crystalline silicon pipe $2a$ and the other electrode $2c$ which is made of conductive poly crystalline silicon to cover the surface of the dielectric layer $2b$. A first connection line 3 made of conductive poly crystalline silicon is connected with the source $1d$ of the field effect transistor 1. This first connection line 3 is employed to connect the source $1d$ of the field effect transistor 1 with a bit line (not shown), in the case where the foregoing series circuit is employed as a component of the unit cell of a memory having the one transistor and one capacitor structure. The drain $1e$ of the field effect transistor 1 is connected with the one electrode $2a$ of the capacitor 2 by means of a connection piece 5 which penetrates an insulator layer 4 produced to cover the drain $1e$. The other electrode $2c$ of the capacitor 2 horizontally extends from the capacitor 2 (To the right in the drawing). In the case of a memory having the one transistor and one capacitor structure, the other electrode $2c$ of the capacitor 2 is connected with the ground potential.

In order to increase the capacity of the foregoing capacitor having the pipe structure, it is effective to increase the surface area of the pipe. To increase the surface area of the pipe, the height thereof and/or the cross-sectional area of the pipe can be increased. However, an increase in the cross-sectional area of the pipe is accompanied by a decrease in integration, and an increase in height of the pipe is accompanied by a decrease in the mechanical strength of the pipe.

OBJECTS AND SUMMARY OF THE INVENTION

Accordingly, required is a development of a capacitor having the pipe structure produced in a semiconductor device, the capacitor realizing a large amount of electrostatic capacity per unit horizontal area without sacrificing the integration and the mechanical reliability thereof and a method for production thereof.

A first object of this invention is to provide a capacitor having the pipe structure produced in a semiconductor device, the capacitor having a large amount of electrostatic capacity per unit horizontal area thereof.

A second object of this invention is to provide a method for producing a capacitor having the pipe structure produced in a semiconductor device, the capacitor having a large amount of electrostatic capacity per unit horizontal area thereof.

To achieve the foregoing first object of this invention, a capacitor produced in a semiconductor device in accordance with this invention comprising:

a conductive lower plate produced on an insulator layer produced on a conductive semiconductor layer, the conductive semiconductor layer being connected the conductive semiconductor layer via a conductive piece penetrating the insulator layer, a plurality of conductive pipes each of which has a closed bottom and is arranged on the conductive lower plate, a dielectric layer covering the surfaces of the conductive pipes and the conductive lower plate, and a conductive layer covering the surface of the dielectric layer.

The cross section of the foregoing conductive pipe can be a square, a circle or a honeycomb and the foregoing conductive pipes having the cross section of a square or a honeycomb can be arranged zigzag or in a checkered pattern to allow each of them to contact with one another with a point contact.

To achieve the foregoing second object of this invention, a method for producing a capacitor having the pipe structure produced in a semiconductor device, the capacitor having a large amount of electrostatic capacity per unit horizontal area thereof comprising:

a step for producing an insulator layer on a conductive semiconductor layer, the insulator layer being penetrated by a vertical opening which reaches the conductive semiconductor layer, a step for producing a conductive piece electrically connected the conductive semiconductor layer, in the vertical opening, a step for producing a conductive lower plate on the insulator layer, a step for producing a first layer of a material which can be etched on the conductive lower plate, the first layer of the material which can be etched having at least one opening which reaches the conductive lower plate, a step for producing a conductive layer covering the first layer of the material which can be etched and the conductive lower plate, a step for producing a second layer of the material which can be etched on the conductive layer, a step for etching back the second layer of the material which can be etched until the conductive layer arranged on top of the first layer of the material which can be etched is removed, a step for removing the first and second layer of the material which can be etched to produce a plurality of conductive pipes each of which has a closed bottom on the conductive lower plate, a step for producing a dielectric layer to cover the surface of the conductive pipes each of which has a closed bottom and the conductive lower plate, and a step for producing a conductive layer to cover the surface of the dielectric layer.

BRIEF DESCRIPTION OF THE DRAWINGS

This invention, together with its various features and advantages, can be readily understood from the following more detailed description presented in conjunction with the following drawings, in which.

DETAILED DESCRIPTION OF THE PREFERRED EMBODIMENTS

Referring to drawings, a detailed description will be presented below for capacitors produced in a semiconductor device in accordance with four independent embodiments of this invention.

FIRST EMBODIMENT

Figure 1:
FIG. 1 is a connection diagram in which a field effect transistor is connected in series with a capacitor.
Figure 2:
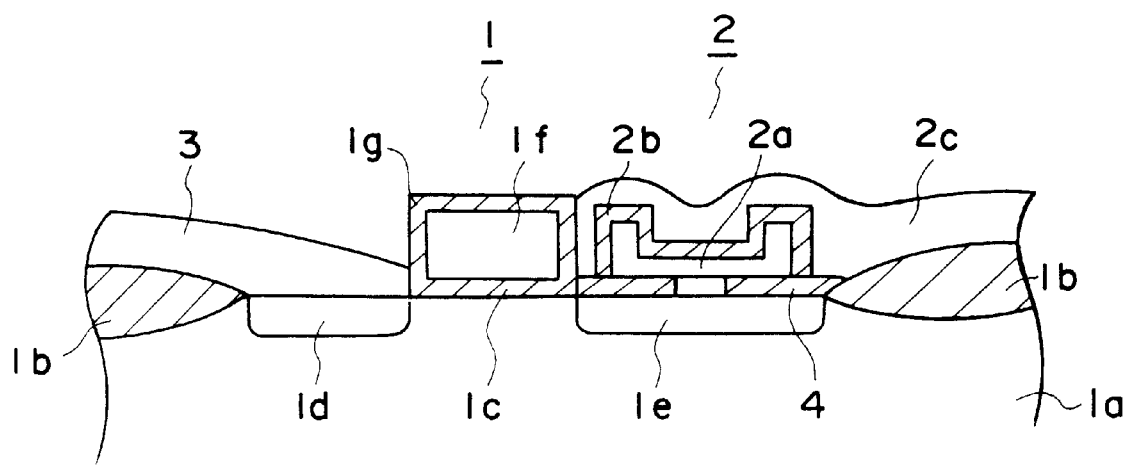
FIG. 2 is a schematic cross section of a series circuit in which a field effect transistor is connected in series with a capacitor having the pipe structure produced in a semiconductor device.
Figure 3:
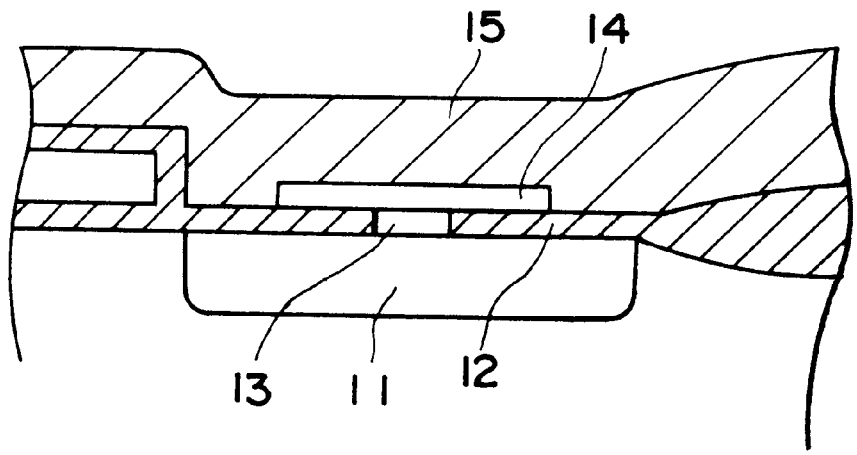
FIG. 3 is a schematic cross section of a capacitor produced in a semiconductor device in accordance with the first embodiment of this invention, under production.

A capacitor having the pipe structure produced in a semiconductor device, the capacitor having conductive pipes having the rectangular horizontal shape and being arranged in parallel to one another Referring to FIG. 3, a CVD process is employed to produce a silicon dioxide layer 12 on a conductive semiconductor layer 11, which is in this example the drain of a field effect transistor which is potentially employed for a memory cell having the one transistor and one capacitor structure. A combination of a photo lithography process and a CVD process is employed to produce a conductive piece 13 of poly crystalline silicon which penetrates the silicon dioxide layer 12. A conductive poly crystalline silicon layer 14 is produced on the silicon dioxide layer 12 employing a CVD process and the conductive poly crystalline silicon layer 14 is patterned into the shape of a conductive lower plate. A CVD process is employed to produce a silicon dioxide layer 15 on the conductive lower plate 14.

Figure 4:
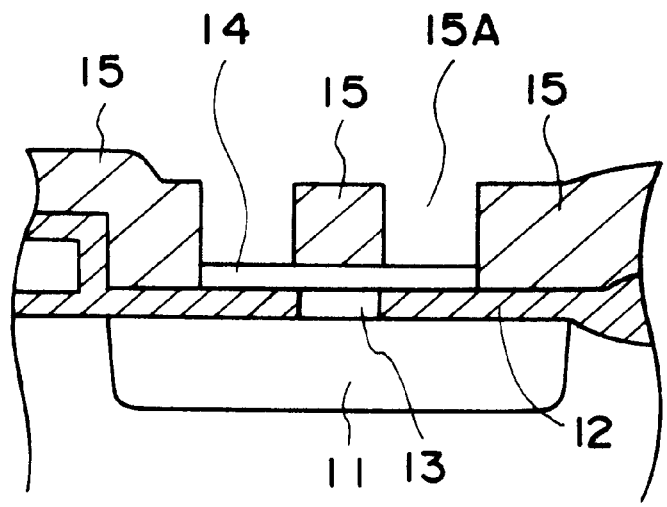
FIG. 4 is a schematic cross section of a capacitor produced in a semiconductor device in accordance with the first embodiment of this invention, under production.

Referring to FIG. 4, a photo lithography process is employed to produce two openings 15A each of which reaches the conductive lower plate 14 and extends in the direction perpendicular to the page of the drawing. The horizontal shape of the opening 15A is a rectangle having the longer side in the direction perpendicular to the page of the drawing. The openings 15A are arranged in parallel to each other.

Figure 5:
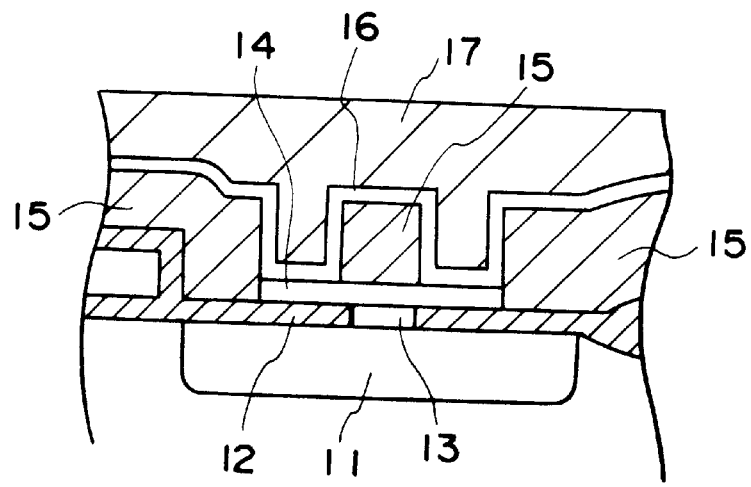
FIG. 5 is a schematic cross section of a capacitor produced in a semiconductor device in accordance with the first embodiment of this invention, under production.

Referring to FIG. 5, a CVD process is employed to produce a conductive poly crystalline silicon layer 16 to cover the silicon dioxide layer 15 and the conductive lower plate 14. Further, a silicon dioxide layer 17 is produced to cover the conductive poly crystalline silicon layer 16.

Figure 6:
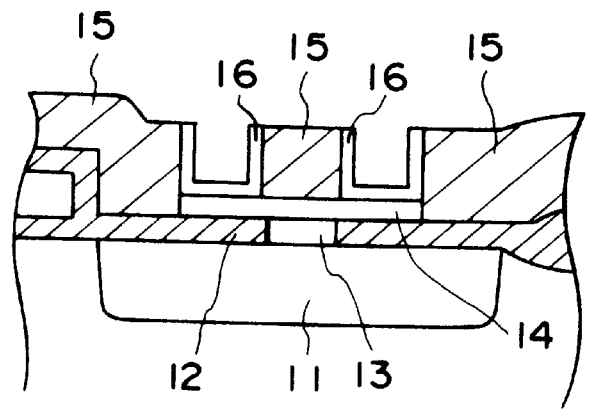
FIG. 6 is a schematic cross section of a capacitor produced in a semiconductor device in accordance with the first embodiment of this invention, under production.

Referring to FIG. 6, the silicon dioxide layer 17 is etched back until the horizontal parts of the conductive poly crystalline silicon layer 16 are removed. The horizontal shape of the conductive poly crystalline silicon layer 16 which remains unetched is a rectangle having the longer side in the direction perpendicular to the page of the drawing.

Figure 7:
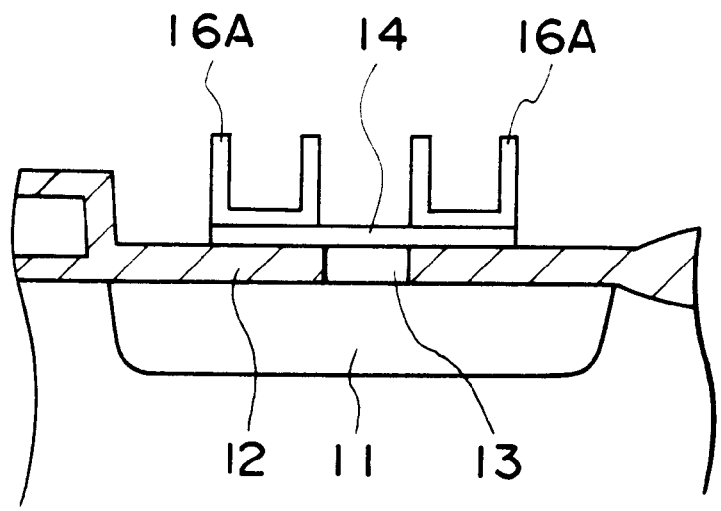
FIG. 7 is a schematic cross section of a capacitor produced in a semiconductor device in accordance with the first embodiment of this invention, under production.

Referring to FIG. 7, an etching process is employed to entirely remove the silicon dioxide layer 15. As a result, two conductive pipes 16A each of which has the closed bottom are produced. Each of the conductive pipes 16A is electrically connected to the conductive semiconductor layer (drain) 11 via the conductive lower plate 14 and the conductive piece 13. The horizontal shape of the conductive pipe 16A which has the closed bottom is again a rectangle having the longer side in the direction perpendicular to the page of the drawing. The conductive pipes 16A are arranged in parallel to each other. The conductive pipes 16A each of which has the closed bottom, work as one electrode of the capacitor of this embodiment.

Figure 8:
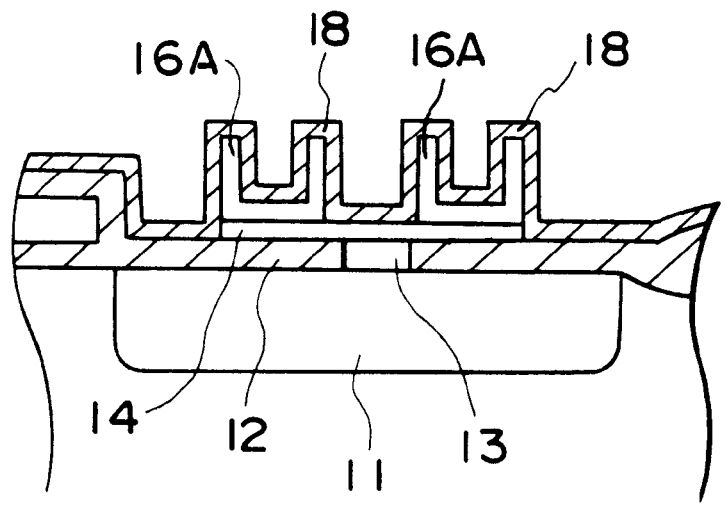
FIG. 8 is a schematic cross section of a capacitor produced in a semiconductor device in accordance with the first embodiment of this invention, under production.

Referring to FIG. 8, a CVD process is employed to produce a silicon nitride layer 18 to cover the conductive pipes 16A each of which has the closed bottom. The silicon nitride layer 18 works as the dielectric layer of the capacitor of this embodiment.

Figure 9:
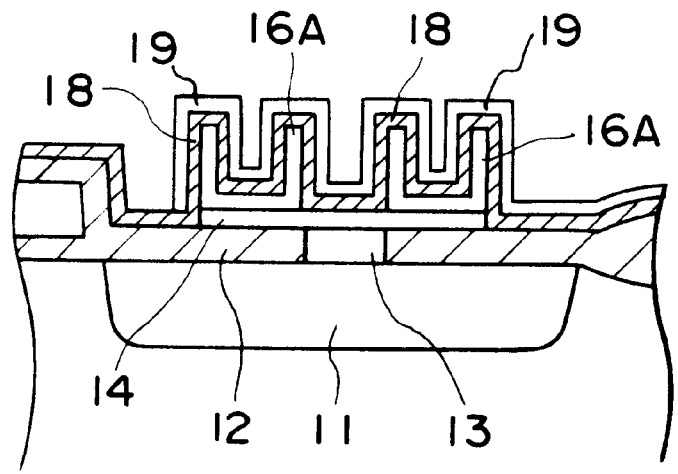
FIG. 9 is a schematic cross section of a capacitor produced in a semiconductor device in accordance with the first embodiment of this invention, under production.

Referring to FIG. 9, a CVD process is employed to produce a conductive poly crystalline silicon layer 19 to cover the silicon nitride layer 18. The conductive poly crystalline silicon layer 19 is patterned to make the other electrode of the capacitor of this embodiment. The other electrode 19 is connected with the ground potential, in the case of a memory cell having the one transistor and one capacitor structure.

In this manner, the capacitor having the pipe structure and which is produced in a semiconductor device in accordance with the first embodiment of this invention is allowed to have a large surface area in which two electrodes face each other across a dielectric layer, without being accompanied by the necessity to increase the height thereof. As a result, the capacitor having the pipe structure and which is produced in a semiconductor device in accordance with the first embodiment of this invention is allowed to have a large amount of electrostatic capacity per unit horizontal area, without being accompanied by a decrease in integration and a decrease in the mechanical reliability.

SECOND EMBODIMENT

Figure 10:
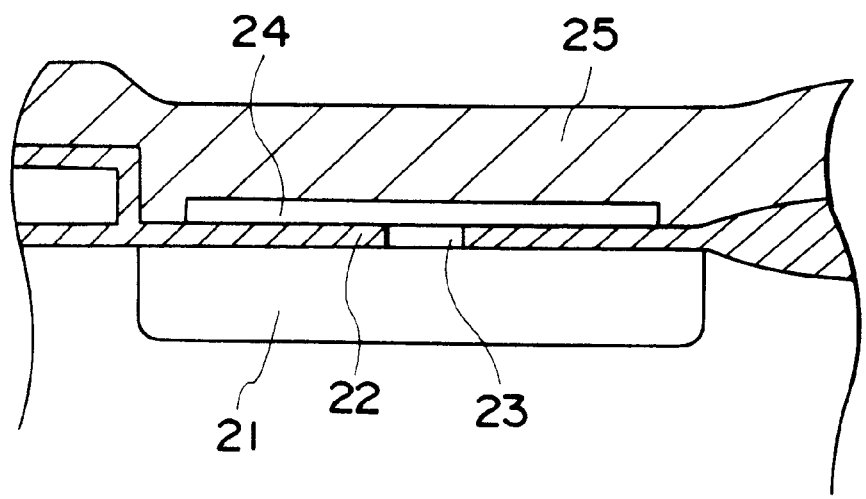
FIG. 10 is a schematic cross section of a capacitor produced in a semiconductor device in accordance with the second embodiment of this invention, under production.

A capacitor having the pipe structure produced in a semiconductor device, the capacitor having conductive pipes each of which has a square horizontal shape and which are arranged in a checkered pattern Referring to FIG. 10, a CVD process is employed to produce a silicon dioxide layer 22 on a conductive semiconductor layer 21, which is in this example the drain of a field effect transistor which is potentially employed for a memory cell having the one transistor and one capacitor structure. A combination of a photo lithography process and a CVD process is employed to produce a conductive piece 23 of conductive poly crystalline silicon which penetrates the silicon dioxide layer 22. A poly crystalline silicon layer 24 is produced on the silicon dioxide layer 22 employing a CVD process and the poly crystalline silicon layer 24 is patterned into the shape of a conductive lower plate. A CVD process is employed to produce a silicon dioxide layer 25 on the conductive lower plate 24.

Figure 11:
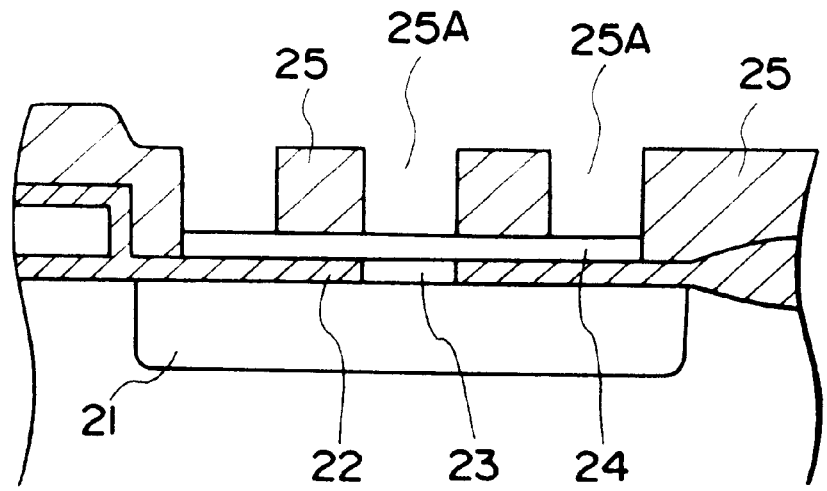
FIG. 11 is a schematic cross section of a capacitor produced in a semiconductor device in accordance with the second embodiment of this invention, under production.
Figure 12:
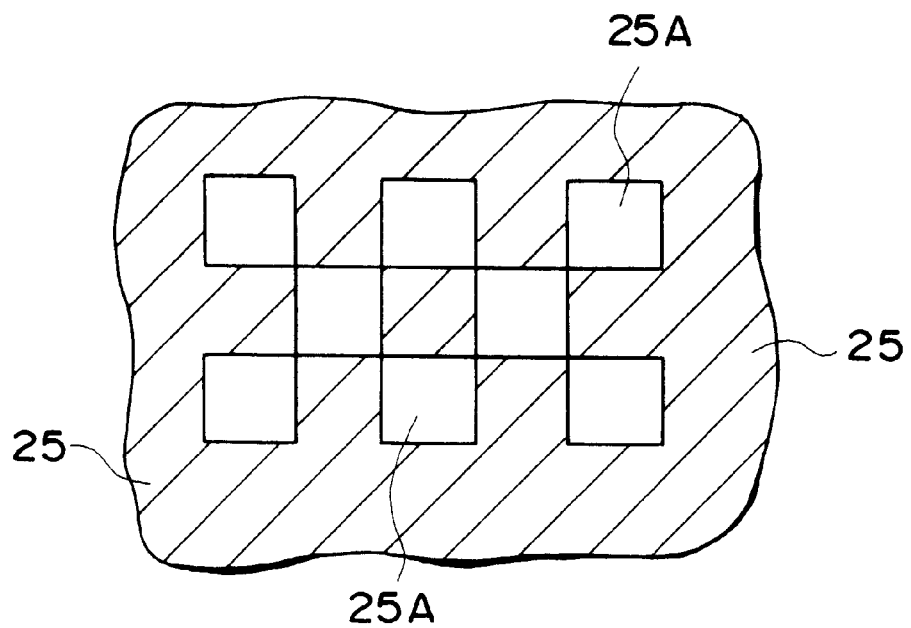
FIG. 12 is a plan view of FIG. 11.

Referring to FIG. 11 illustrating the schematic side view of a capacitor produced in a semiconductor device, under production and to FIG. 12 illustrating the plan view of FIG. 11, a photo lithography process is employed to produce eight openings 25A each of which has a square horizontal shape and reaches the conductive lower plate 24. They are arranged in a checkered pattern. As a result, the horizontal shape of the silicon dioxide layer 25 having openings 25A of a checkered pattern is as shown in FIG. 12.

Figure 13:
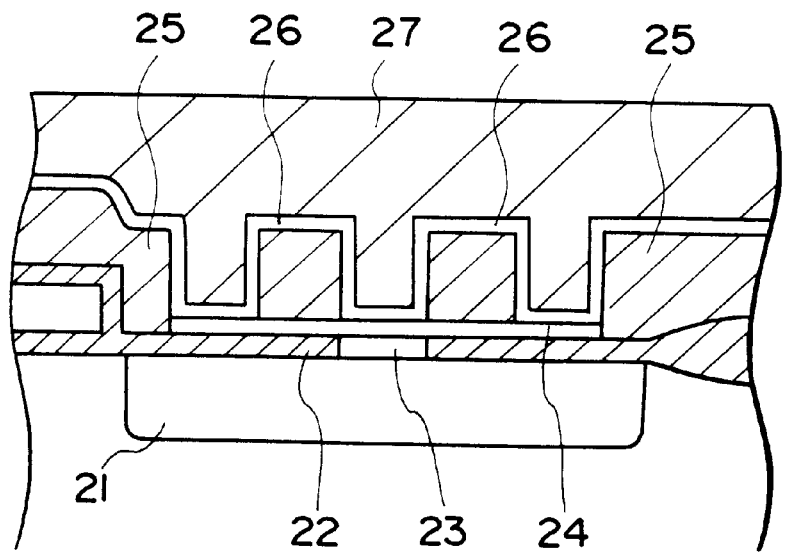
FIG. 13 is a schematic cross section of a capacitor produced in a semiconductor device in accordance with the second embodiment of this invention, under production.

Referring to FIG. 13, a CVD process is employed to produce a conductive poly crystalline silicon layer 26 to cover the silicon dioxide layer 25 having openings 25A arranged in a checkered pattern and the conductive lower plate 24. Further, a silicon dioxide layer 27 is produced to cover the conductive poly crystalline silicon layer 26.

Figure 14:
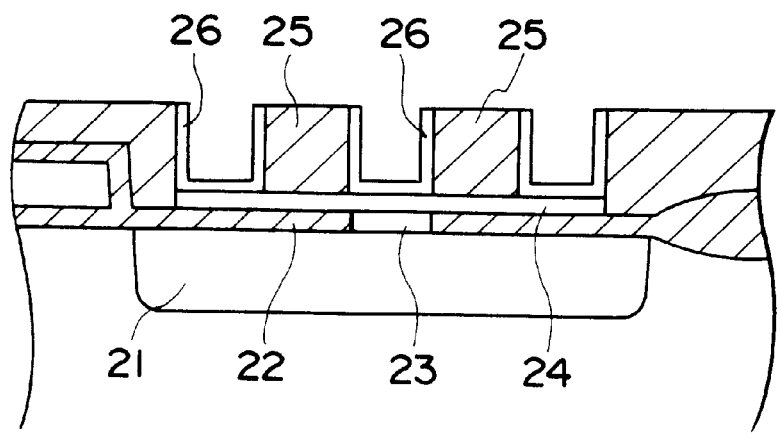
FIG. 14 is a schematic cross section of a capacitor produced in a semiconductor device in accordance with the second embodiment of this invention, under production.

Referring to FIG. 14, the silicon dioxide layer 27 is etched back until the horizontal parts of the conductive poly crystalline silicon layer 26 are removed.

Figure 15:
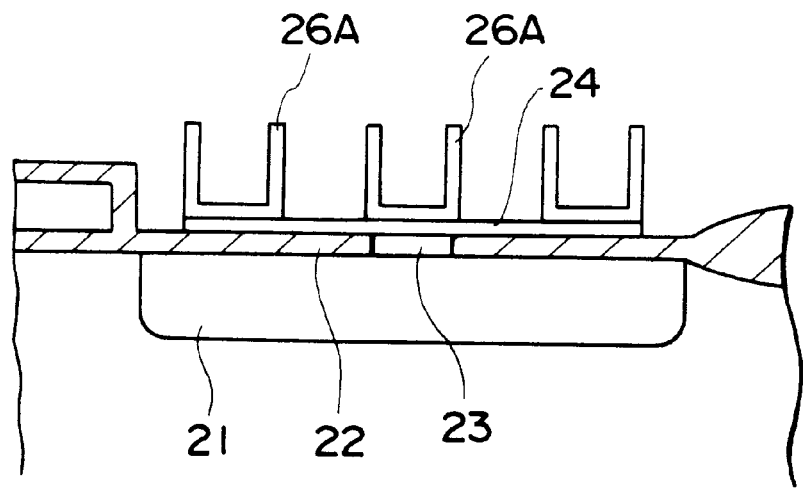
FIG. 15 is a schematic cross section of a capacitor produced in a semiconductor device in accordance with the second embodiment of this invention, under production.
Figure 16:
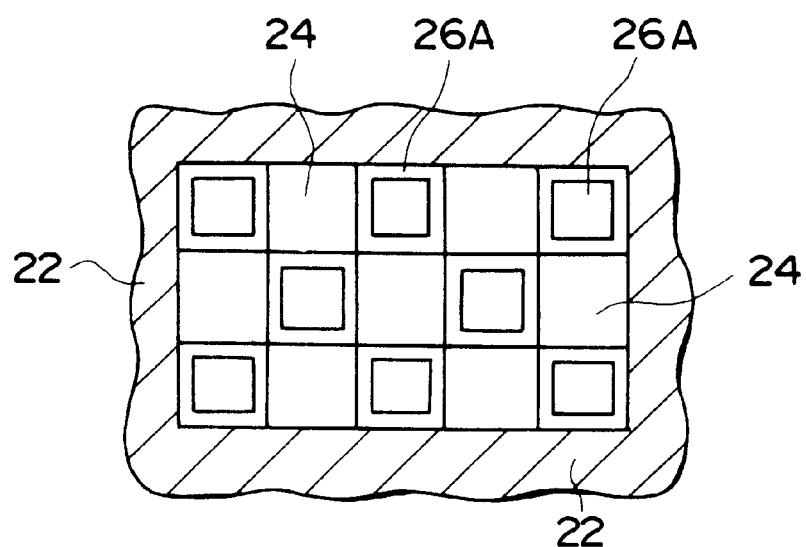
FIG. 16 is a plan view of FIG. 15.

Referring to FIG. 15 illustrating the schematic side view of a capacitor produced in a semiconductor device, under production in accordance with the second embodiment of this invention and to FIG. 16 illustrating the plan view of FIG. 15, an etching process is employed to entirely remove the silicon dioxide layers 27. As a result, eight conductive pipes 26A each of which has the closed bottom are produced. The horizontal shape of the conductive pipes 26A each of which has the closed bottom and which are arranged in a checkered pattern to allow each of the conductive pipes 26A to contact with one another with a point contact, is as shown in FIG. 16. Each of the conductive pipes 26A is electrically connected the conductive semiconductor layer (drain) 21 via the conductive lower plate 24 and the conductive piece 23.

Figure 17:
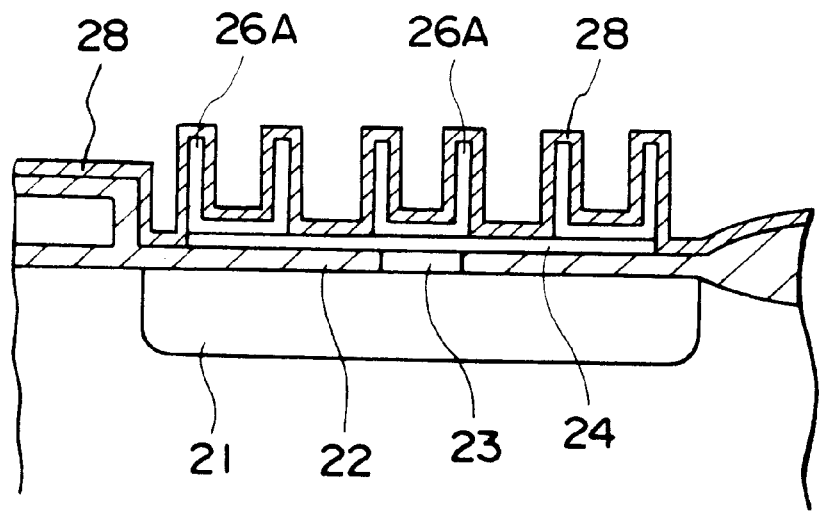
FIG. 17 is a schematic cross section of a capacitor produced in a semiconductor device in accordance with the second embodiment of this invention, under production.

Referring to FIG. 17, a CVD process is employed to produce a silicon nitride layer 28 to cover the conductive pipes 26A having the closed bottom. The silicon nitride layer 28 works as the dielectric layer of the capacitor of this embodiment.

Figure 18:
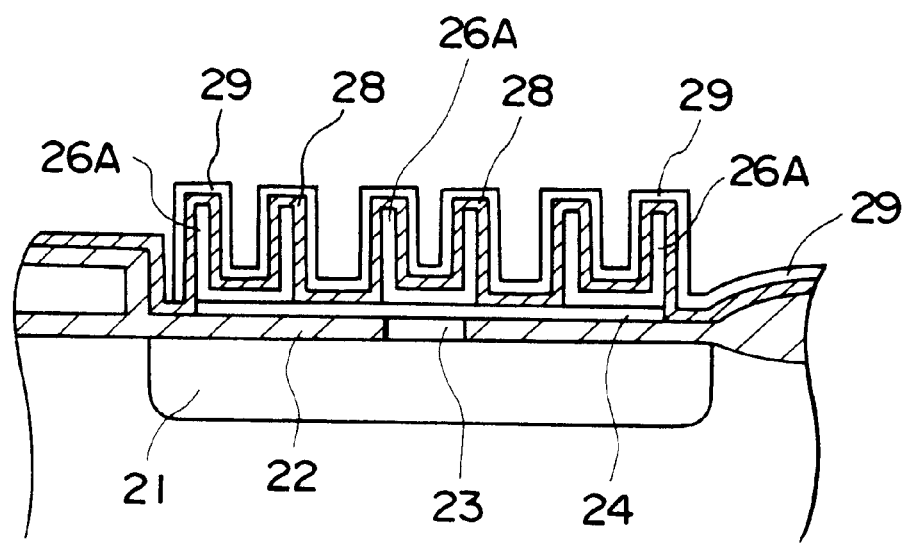
FIG. 18 is a schematic cross section of a capacitor produced in a semiconductor device in accordance with the second embodiment of this invention, under production.

Referring to FIG. 18, a CVD process is employed to produce a conductive poly crystalline silicon layer 29 to cover the silicon nitride layer 28. The conductive poly crystalline silicon layer 29 is patterned to the shape of the other electrode of the capacitor of this embodiment. The other electrode 29 is connected with the ground potential, in the case where the capacitor is employed as a component of a memory cell having the one transistor and one capacitor structure.

In this manner, the capacitor having the pipe structure and which is produced in a semiconductor device in accordance with the second embodiment of this invention is allowed to have a surface area in which two electrodes face to each other across a dielectric layer which surface area is larger than that of the first embodiment, without being accompanied by necessity to increase the height thereof. As a result, the capacitor having the pipe structure and which is produced in a semiconductor device in accordance with the second embodiment of this invention is allowed to have a amount of electrostatic capacity per unit horizontal area which is larger than that of the first embodiment, without being accompanied by a decrease in integration and a decrease in the mechanical reliability.

THIRD EMBODIMENT

Figure 19:
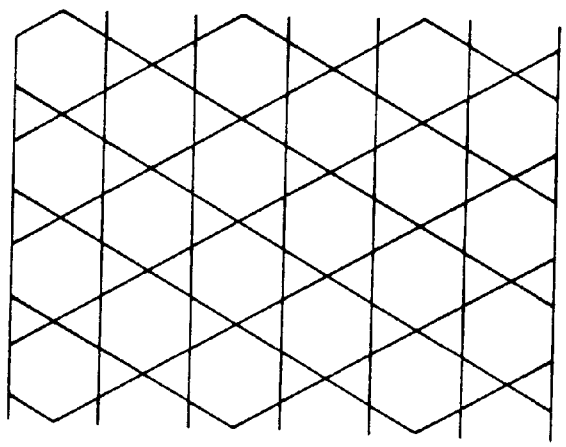
FIG. 19 is a horizontal pattern in which the conductive pipes having a closed bottom are arranged, in accordance with the third embodiment of this invention.

A capacitor having the pipe structure produced in a semiconductor device, the capacitor having conductive pipes each of which has a honeycomb shape and which are arranged in a checkered pattern FIG. 19 is a horizontal pattern in which the conductive pipes each of which has a closed bottom are arranged for a capacitor produced in a semiconductor device in accordance with this embodiment.

The only difference between the third embodiment and the second embodiment is the horizontal shape of the conductive pipes each of which has a closed bottom. Although they are squares in the second embodiment, they are honeycomb in the third embodiment.

FOURTH EMBODIMENT

Figure 20:
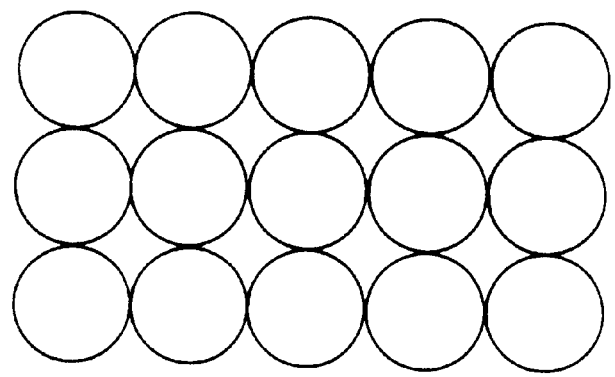
FIG. 20 is a horizontal pattern in which the conductive pipes having a closed bottom are arranged, in accordance with the fourth embodiment of this invention.

A capacitor having the pipe structure produced in a semiconductor device, the capacitor having conductive pipes each of which has the shape of a circle and which are arranged in a checkered pattern FIG. 20 is a horizontal pattern in which the conductive pipes each of which has a closed bottom are arranged for a capacitor produced in a semiconductor device in accordance with this embodiment.

The only difference between the fourth embodiment and the second embodiment is the horizontal shape of the conductive pipes each of which has a closed bottom. Although they are squares in the second embodiment, they are circles in the fourth embodiment.

The foregoing description has clarified that a capacitor having the pipe structure produced in a semiconductor device and having advantage that a large amount of electrostatic capacity is realized per unit horizontal area without being accompanied by disadvantages that decrease integration and mechanical reliability and a method for production thereof, is successfully provided by this invention.

Although the invention has been described with reference to specific embodiments, this description is not meant to be construed in a limiting sense. Various modifications of the disclosed embodiments, as well as other embodiments of this invention, will be apparent to persons skilled in the art upon reference to the description of this invention. It is therefore contemplated that the appended claims will cover any such modifications or embodiments as fall within the true scope of this invention.

What is claimed:

1. A capacitor having a pipe structure produced in a semiconductor device comprising:

a conductive lower plate produced on an insulator layer produced on a semiconductor layer, said conductive lower plate being coupled to said semiconductor layer, a plurality of conductive pipes which are arranged on said conductive lower plate such that each of said plurality of conductive pipes contact at least one other of said plurality of conductive pipes, a dielectric layer covering the surfaces of said conductive pipes and said conductive lower plate, and a conductive layer covering the surface of said dielectric layer, wherein each of said plurality of conductive pipes includes at least one corner edge extending upward from said conductive lower plate, and wherein said plurality of conductive pipes are arranged such that adjacent ones of said conductive pipes contact one another exclusively at said corner edges thereof.

2. A capacitor having the pipe structure produced in a semiconductor device in accordance with claim 1, wherein said conductive lower plate, and said conductive pipes, are made of conductive poly crystalline silicon.

3. A capacitor having the pipe structure produced in a semiconductor device in accordance with claim 1 or 2, wherein each of said conductive pipes has the horizontal shape of rectangle and said conductive pipes are arranged in parallel to one another.

4. A capacitor having the pipe structure produced in a semiconductor device in accordance with claim 1 or 2, wherein each of said conductive pipes has the horizontal shape of square and said conductive pipes are arranged in a checkered pattern.

5. A capacitor having the pipe structure produced in a semiconductor device in accordance with claim 1 or 2, wherein each of said conductive pipes has the horizontal shape of honeycomb and said conductive pipes are arranged in a checkered pattern.

* * * * *